(12) United States Patent
Troxell et al.

(10) Patent No.: US 8,164,045 B2
(45) Date of Patent: Apr. 24, 2012

(54) OPTICAL SYSTEM FOR CONTROLLING LIGHT PROPAGATION ALONG A LIGHT PATH

(75) Inventors: John R. Troxell, Sterling Heights, MI (US); Ronald M. Taylor, Greentown, IN (US)

(73) Assignee: Delphi Technologies, Inc., Troy, MI (US)

( * ) Notice: Subject to any disclaimer, the term of this patent is extended or adjusted under 35 U.S.C. 154(b) by 265 days.

(21) Appl. No.: 12/698,385

(22) Filed: Feb. 2, 2010

(65) Prior Publication Data

US 2010/0200737 A1 Aug. 12, 2010

Related U.S. Application Data

(60) Provisional application No. 61/151,001, filed on Feb. 9, 2009.

(51) Int. Cl.
*H01L 31/0232* (2006.01)
(52) U.S. Cl. .............. 250/227.2; 382/104; 359/630
(58) Field of Classification Search ............... 250/227.2; 382/104; 359/630
See application file for complete search history.

(56) References Cited

U.S. PATENT DOCUMENTS

| 5,172,100 A * | 12/1992 | Iino ............................ 359/630 |
| 6,928,180 B2 * | 8/2005 | Stam et al. ................... 382/104 |
| 7,095,567 B2 | 8/2006 | Troxell et al. |

\* cited by examiner

*Primary Examiner* — Seung C Sohn
(74) *Attorney, Agent, or Firm* — Lawrence D. Hazelton

(57) ABSTRACT

An optical system and method for controlling light propagation along a light path. An optical element such as a lens is formed of a first light transmitting material and has a surface finish effective to scatter light impinging on the surface. Index matching material contacts to a portion of the surface so as to reduce or nullify the scattering effects of the surface finish within the portion. This allows the first optical element to have surfaces that have been generally prepared for scattering light and then later selectively negate the scattering effects of the surface finish by contacting portions of the surface with index matching material. As such, light in the optical element directed toward a surface or boundary within selected portion propagates into or out of the optical element. Light outside of the selected portion is scattered. Such an arrangement helps to reduce image degradation due to light outside of the light path being reflected about within the optical system.

12 Claims, 2 Drawing Sheets

OPTICAL SYSTEM FOR CONTROLLING LIGHT PROPAGATION ALONG A LIGHT PATH

CROSS-REFERENCE TO RELATED APPLICATION

This application claims the benefit under 35 U.S.C.§119(e) of U.S. Provisional Patent Application No. 61/151,001, filed Feb. 9, 2009, the entire disclosure of which is hereby incorporated herein by reference.

TECHNICAL FIELD OF INVENTION

The invention generally relates to an optical system, and more particularly relates to a system that scatters light that is reflected out of a light path.

BACKGROUND OF INVENTION

Optical systems such as cameras typically employ multiple optical elements formed of various materials leading to interfaces between materials having different optical properties. Examples include lenses formed of various glasses, polymers, sapphire, and quartz. Other materials forming optical elements include air or other gasses, mirrors, and light detectors in the form of integrated circuits. Generally, at each interface a majority portion of the incident light is transmitted out of one optical element toward an adjacent optical element, and a minority portion is reflected back into the optical element. The reflected light may subsequently undergo additional reflections such that the light may again proceed through the interface and may be detected by an image sensor. Because this portion of reflected light has traveled a different path than the initially transmitted portion of light, the image pattern detected by the image sensor may be degraded. This degradation may be seen as halos, ghost images, or glare, for example.

SUMMARY OF THE INVENTION

In accordance with one embodiment of this invention, an optical system for controlling light propagation along a light path is provided. The optical system comprises a first optical element, a second optical element, and an index matching region. The first optical element is formed of a first light transmitting material having a first index of refraction. The first optical element comprises a first boundary arranged to intersect the light path. The first boundary has a surface finish effective to scatter light impinging on the first boundary. The second optical element comprises a second boundary arranged to intersect the light path. The second boundary is also arranged to face the first boundary and to be separated from the first boundary by a gap that intersects the light path. The index matching region occupies a portion of the gap. The index matching region comprises a second light transmitting material that has a fluidic state when dispensed and a matching index of refraction after being dispensed. The index matching region is arranged to contact a first portion of the first boundary and to contact a second portion of the second boundary. By such an arrangement, light in the first optical element directed toward the first boundary that is within the first portion propagates to the second portion, and light directed toward the first boundary that is not within the first portion is scattered.

In another embodiment of the present invention, a method for controlling light propagation along a light path is provided. The method includes the step of forming a first optical element to define a first boundary. The first optical element is formed of a first light transmitting material. The first boundary has a surface finish effective to scatter light impinging on the first boundary. The method also includes the steps of forming a second optical element to define a second boundary and arranging the first optical element and the second optical element so that the first boundary and the second boundary intersect the light path and to define a gap therebetween. The method further includes the step of dispensing an index matching material into an index matching region of the gap to make contact with a first portion of the first boundary and a second portion of the second boundary. The step of dispensing is effective to minimize the scattering effect of the surface finish within the first portion such that light passes through the first portion to the second boundary.

Further features and advantages of the invention will appear more clearly on a reading of the following detail description of the preferred embodiment of the invention, which is given by way of non-limiting example only and with reference to the accompanying drawings.

BRIEF DESCRIPTION OF DRAWINGS

The present invention will now be described, by way of example with reference to the accompanying drawings, in which.

DETAILED DESCRIPTION OF INVENTION

Figure 1:
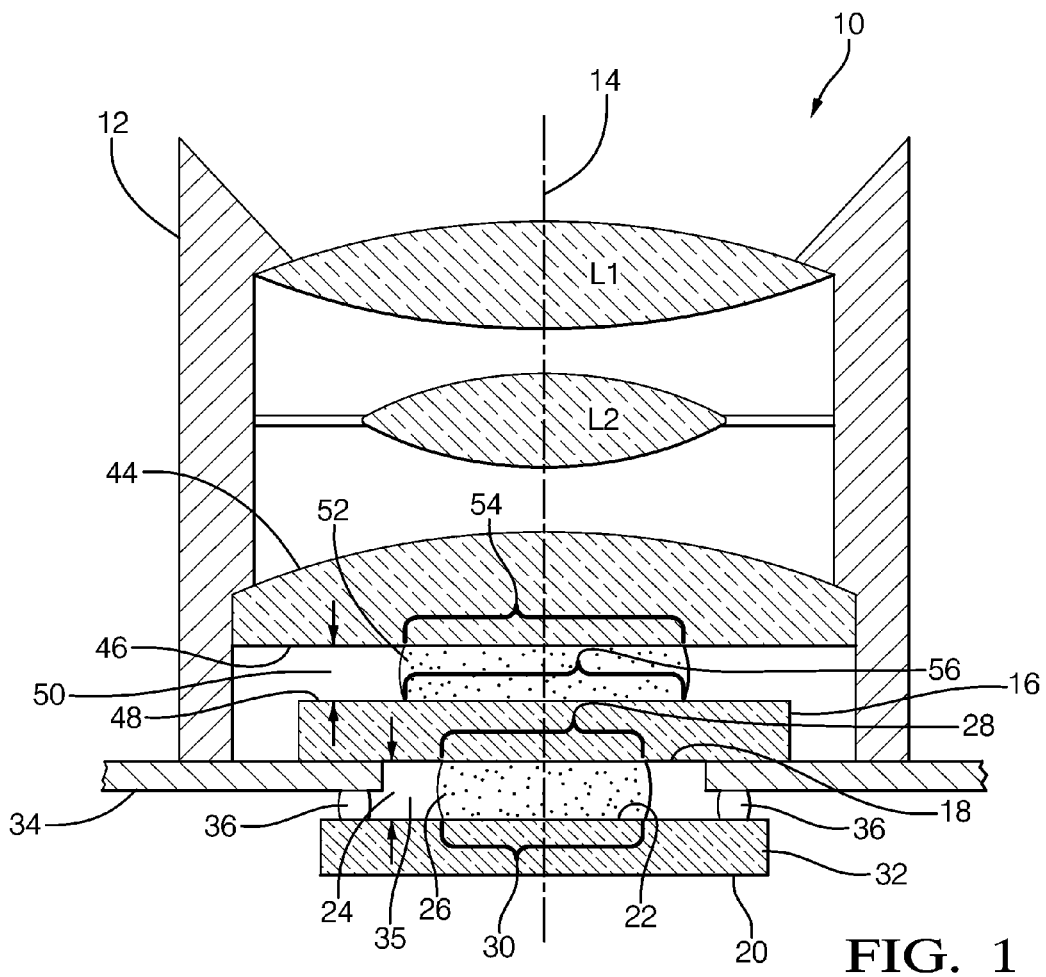
FIG. 1 is cross section view of an optical system in accordance with one embodiment.

In accordance with an embodiment of an optical system 10, FIG. 1 illustrates a camera assembly 12. The camera assembly 12 is a non-limiting example of an optical system that may employ features of the optical system 10 described herein that are in general, directed to controlling light propagation along a light path 14. The light path 14 is illustrated as being relatively straight line, but is understood to include other light paths that may be bent or redirected by lenses L1 and L2, or may be redirected by a mirror (not shown). As used herein, light being bent means causing a change in the direction of light at a boundary or surface of an optical device either by reflection or due to a change in the index of refraction of material transmitting light The system 10 may include a first optical element 16 formed of a first light transmitting material having a first index of refraction. As used herein, an optical element may be any object or device used to propagate, redirect, or detect light. Exemplary optical elements may include, but are not limited to, lenses, minors, or image detectors. In one embodiment, the first optical element 16 is a bi-planar lens as illustrated in FIG. 1 that may be formed of plate glass. Alternately, the first optical element 16 may be planar on one side and curved on the other, or curved on both sides. Suitable light transmitting materials may include various types of glass, transparent polymers, or non-glassy transparent solids such as sapphire or quartz. Such materials may have indices of refraction on the order of 1.5 or greater, in contrast to air that has an index of refraction of about 1.0.

The first optical element 16 defines a first boundary 18. The first boundary 18 may also be arranged to intersect the light path 14. In one embodiment the first boundary 18 may have a surface finish effective to scatter light impinging on the first boundary 18. As used herein, a surface finish effective to scatter light means that the boundary of an optical element is such that light impinging on the boundary is randomized so as to reduce or eliminate the organized transmission or reflection of light such as light organized in the form of an image. As one non-limiting example, such a surface finish may have the appearance of frosted glass. Such a surface finish may be formed by roughening, abrading, texturing, or otherwise treating the surface of the first optical element 16. Various techniques to create such a scattering surface include acid etching the die mold used to form an optical element, or various methods of etching the optical element surface such as solution, plasma, or laser based etching. Such a scattering surface finish may also result from insufficient preparation or machining of an optical surface or as a result of accidental scratching.

The optical system 10 may include a second optical element 20 that defines a second boundary 22 arranged to intersect the light path 14. In one non-limiting embodiment the second boundary 22 is arranged to face the first boundary 18 and be separated from the first boundary 18 by a gap 24 that intersects the light path 14. The second optical element 20 may be a lens formed of light transmitting material; a mirror formed of light reflecting material; or may be an array of light detectors that are part of an image detecting device.

The optical system 10 may include an index matching region 26 occupying a portion of the gap 24. In one embodiment, the index matching region 26 is filled with a second light transmitting material that may be in a fluidic state when it is dispensed. As used herein, a fluidic state includes material that is liquid and as such can be poured, or a gel that readily conforms to or wets a surface. Alternately, the second light transmitting material may have a predetermined shape such as a sphere or column, and wets the boundary of an optical element by way of an additional process such as heating the second light transmitting material after it is dispensed so as to wet the boundary. The first optical element 16 and the second optical element 20 may be arranged such that when the second light transmitting material is dispensed it makes contact with and conforms to a first portion 28 of the first boundary 18. While not subscribing to any particular theory, the effect of the second light transmitting material contacting the first portion 28 may be to reduce or nullify the scattering effect of the scattering surface of the first boundary 18 within the first portion 28. After the second light transmitting material is dispensed it may remain in a liquid state, and be held in place by capillary action or some sort of seal arrangement, or it may cure and possibly act as an adhesive to hold the first optical element 16 and the second optical element 20 together.

By this arrangement, for the first optical element 16 with the first boundary 18 having a surface finish effective to scatter light impinging on the first boundary 18, a greater fraction of light propagates through the first portion 28 than is reflected or scattered. Also by this arrangement, a greater fraction of light impinging on the first boundary 18 outside the first portion 28 is reflected or scattered than propagates through the first boundary 18. As such, the entire first boundary 18 of the first optical element 16 may be treated to have a scattering surface finish, and then have the image transmitting capability of the first portion 28 restored or improved by selectively contacting the first boundary 18 within the first portion 28 with second light transmitting material. This avoids having to selectively polish the first portion 28 so images can be transmitted through the first portion 28 and selectively etching or otherwise preparing the first boundary 18 outside of the first portion 28 to have a scattering finish. This also avoids having to physically align or otherwise precisely align the first optical element 16 with the second optical element 20 during assembly.

After being dispensed, and curing if appropriate, the second light transmitting material may be characterized as having a matching index of refraction. It is understood by those skilled in the art that the fraction of incident light transmitted through the first boundary 18 and not scattered or reflected is dependent on how close the value of the matching index of refraction is to the value of the first index of refraction. As such, one embodiment may have the matching index of refraction substantially equal to the first index of refraction. As used herein, index of refractions are considered to be substantially equal if the values are within +/−10% of each other, and are considered to be substantially unequal otherwise. In general, the greater the difference between the indices of refraction of two adjacent material surfaces, the greater the percentage of incident light that is reflected at the boundary between the two material surfaces. It should be understood that +/−10% may be chosen as a general guideline for an optical system, such as an inexpensive camera, and some value other than +/−10% may be selected by one skilled in the art in accordance with design requirements associated with another optical system. Having the indexes of refraction equal is advantageous because the fraction of incident light transmitted from the first optical element 16 into the index matching region 26 is maximized and thus the fraction of incident light that is scattered or reflected is minimized.

The index matching region 24 may also be arranged so the second light transmitting material also contacts a second portion 30 of the second boundary 22. In one embodiment, the second optical element 20 comprises an imaging device 32 arranged such that the second boundary 22 comprises an imaging side of the imaging device 32, and the second portion 30 comprises an imaging area of the imaging device 32. As used herein, an imaging device generally comprises an array of light detectors arranged to detect organized patterns of light forming an image and output a signal corresponding to the image. As one example, the imaging device may be a CMOS imager such as an Omnivision model OV7960. Such an arrangement may be advantageous because the area that light impinges on the imaging device 32 is minimized so that the amount of light that may be reflected by the imaging device 32 and cause degradation of the imaged detected by the imaging device 32 is minimized. By this arrangement, light that is reflected may either be scattered if it impinges on the first boundary 18 outside the first portion 28, or may be transmitted through the first boundary 18 and away from the imaging device 32 if it impinges on the first boundary 18 inside the first portion 28. In either case, the reflected light will less likely to corrupt the image detected by the imaging device 32.

In one non-limiting embodiment the imaging device 32 may be arranged in an integrated circuit package 34 defining an opening 35 for light to pass through and illuminate the imaging device 32. The integrated circuit package 34 may simplify making an electrical connection to the imaging device 32 by providing interconnect features such as solder bumps 36. The integrated circuit package 34 may be open as illustrated in FIG. 1, or may further comprise packaging material covering the side of the imager device 32 opposite the second boundary 22. When the integrated circuit package 34 is assembled, it may also include the first optical element 16 acting as a window into the integrated circuit package 34 arranged to cover the opening 35 and thereby better protect the imaging device 32 from damage such as damage caused by contamination or a foreign object contacting the imaging device 32.

Figure 2:
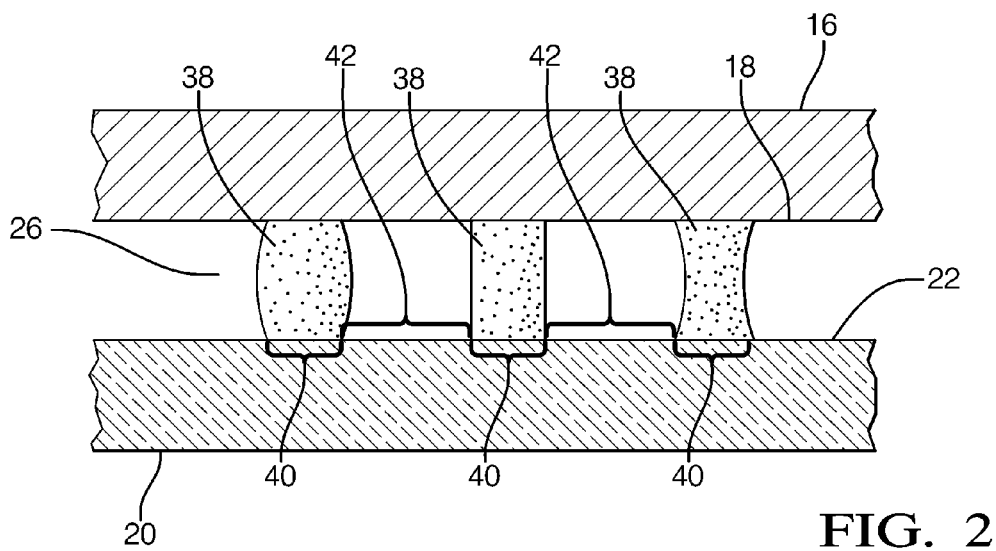
FIG. 2 is detailed cross section view of one embodiment of the optical system illustrated in FIG. 1.

FIG. 2 shows an embodiment of the optical system 10 where the index matching region 26 includes a plurality of separate regions 38 formed of the second light transmitting material. These separate regions 38 may be formed by selectively applying the index matching material to define a plurality of distinct light paths between the first boundary 18 and the second boundary 22. The separate regions 38 may be dispensed by a variety of means. By way of some non-limiting examples, the separate regions may be formed of elastic material that is squeezed between the first optical element 16 and the second optical element 20 and thereby take on a bulged or convex shape, or may be dispensed as a preformed piece of material having straight sides, or may be cured in place after being dispensed and assume a convex shape. Typically, these separate regions may be within the first portion 28 and/or within the second portion 30. The separate regions 38 may be useful to selectively direct light toward specific spots on the second boundary 22 when, for example, the second boundary 22 is an imaging side of the imaging device 32. With such an arrangement light may generally be guided to impinge only on detecting areas 40 where discrete light detectors or pixels may be present, and not impinge on non-detecting areas 42 of the imaging device 32. As such, the amount of light reflected off the second boundary 22 may be minimized and thereby minimize degradation of an image detected by the imaging device 32.

Referring again to FIG. 1, an embodiment of the optical system 10 may include a third optical element 44 formed of a third light transmitting material having a third index of refraction. The third optical element 44 defines a third boundary 46 that may be arranged to intersect the light path 14. The third boundary 46 may have a surface finish effective to scatter light impinging on the third boundary 46. The first optical element 16 may further comprise a fourth boundary 48 arranged to intersect the light path 14. The fourth boundary 48 may also have a surface finish that is effective to scatter light impinging on the fourth boundary 48. The third optical element 44 may be arranged relative to the first optical element 16 such that the fourth boundary 48 faces the third boundary 46. The arrangement may be such that the fourth boundary 48 is separated from the third boundary 36 so as to define a second gap 50. The second gap 50 may include a second index matching region 52 occupying a portion of the second gap 50. The second index matching region 52 may be filled with a fourth light transmitting material having a fluidic state when dispensed and have a second matching index of refraction after being dispensed. As such, the second index matching region 52 may contact a third portion 54 of the third boundary 46 and contact a fourth portion 54 of the fourth boundary 48 such that light in the third optical element 44 directed toward the third boundary 46 that is within the third portion 54 propagates through the second index matching region 52 to the fourth portion 56, and light in the third optical element 44 directed toward the third boundary 46 that is not within the third portion 54 is scattered.

In another embodiment of an optical system 10, the second optical element 20 is formed of a third light transmitting material, as opposed to being an imaging device 32 as described above. The third light transmitting material may have a third index of refraction distinct from the first index of refraction or the same as the first index of refraction. It will be recognized by those skilled in the art that the matching index of refraction of the second light transmitting material filling the index matching region 26 may be selected to optimize the desired light transmitting characteristics of the arrangement of first optical element 16, second optical element 20, and the index matching material filling the index matching region 26. In one instance, the third index of refraction may be substantially equal to the first index of refraction.

In one embodiment where the second optical element 20 is formed of a third light transmitting material, the second optical element 20 may be such that the second boundary 22 has a surface finish effective to scatter light impinging on the second boundary 22 except where the second portion 30 is in contact with the index matching region such that light directed toward the first portion 28 and the second portion 30 may not be scattered. Such an arrangement is advantageous when the first optical element 16 and the second optical element 20 are lenses that are optically coupled using the index matching material. Such an arrangement may form a compound lens assembly useful for focusing light in a particular manner. By way of a non-limiting example, the first optical element 16 may be a lens that is common to a variety of optical systems 10 such as a camera assembly 12, and the second optical element 20 may be unique to various cameras, such as a wide view camera versus a narrow view camera.

In one embodiment the first optical element 16 and the third optical element 44 are both made of light transmitting materials, and first index of refraction and the third index of refraction have substantially unequal values. In this embodiment, the optimum second matching index of refraction for the index matching material in the second index matching region 52 may depend on which optical element has a dominating scattering surface finish or other aberration in the light path 14. For example, if the first optical element 16 has a scattering surface finish on the fourth boundary 48, and the third optical element 44 has a surface finish on the third boundary 46 that is optically clear or polished, then it may be desirable for the second index matching material in the second index matching region 52 to have a second matching index of refraction equal to the first index of refraction of the first optical element 16. On the other hand, if both the third boundary 46 and the fourth boundary 48 have scattering surfaces finishes, then it may be desirable for the index matching material in the second index matching region 52 to have a second matching index of refraction equal to a value mid-way between the first index of refraction and the third index of refraction.

Figure 3:
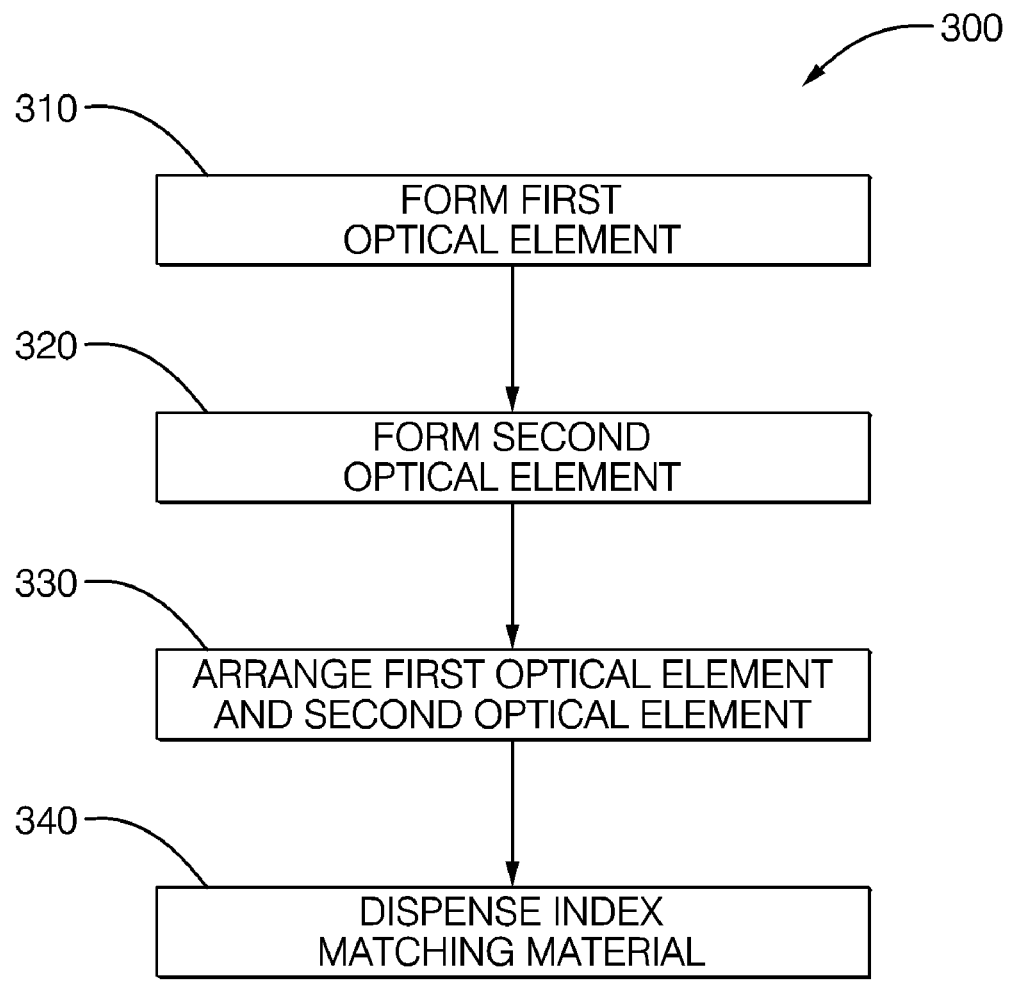
FIG. 3 is a flow chart illustrating a method to assembly the optical systems illustrated in FIGS. 1-2.

FIG. 3 illustrates a method or routine 300 of an embodiment of a method for controlling light propagation along a light path. At step 310, a first optical element 16 is formed to define a first boundary 18. In one embodiment, the first optical element 16 is formed of a first light transmitting material having a first index of refraction and the first boundary 18 has a surface finish effective to scatter light impinging on the first boundary 18. At step 320, a second optical element 20 is formed to define a second boundary 22. The second optical element 20 may be formed of light transmitting material so that the second optical element 20 may be a lens or a window, or may be formed of a non-light transmitting material so that the second optical element 20 may be an imaging device 32. At step 330, the first optical element 16 and the second optical element 20 are arranged so that the first boundary 18 and the second boundary 22 intersect the light path and to define a gap 24 therebetween. At step 340, an index matching material is dispensed into an index matching region 26 of the gap 24 to make contact with a first portion 28 of the first boundary 18 and a second portion 30 of the second boundary 22 effective to minimize the scattering effect of the surface finish within the first portion 28 such that light passes through the first portion 28 to the second boundary 22. The index matching material may be dispensed onto either the first boundary 18 or the second boundary 22 prior to assembly of the first optical element 16 and the second optical element 20, or may be injected into the index matching region 26 after the first optical element 16 and the second optical element 20 are arranged. Index matching material may be injected to fill a portion of the gap 24 such as the index matching region 26, or may be injected to fill a greater area, such as the entire gap 24.

Accordingly, an optical system 10 for controlling light propagation along a light path 14 is provided. An optical element (16, 20, 44) formed of light transmitting material may have one or more boundaries intersecting the light path that have been treated to have a surface finish that scatters light so to minimize image deterioration due to reflected light. When the optical element is assembled with other optical elements, light transmitting characteristics of portions of the scattering boundary may be selectively restored by selectively dispensing fluidic index matching material to portions of the boundary where non-scattering light transmission is desired. Such an arrangement avoids selectively polishing or etching portions of the optical element, and avoids having to align polished or scattering portions of one optical element with another optical element. It should be appreciated that such an arrangement reduces the cost of manufacturing optical systems such as camera assemblies 12.

While this invention has been described in terms of the preferred embodiments thereof, it is not intended to be so limited, but rather only to the extent set forth in the claims that follow.

We claim:

1. An optical system for controlling light propagation along a light path comprising:
    a first optical element formed of a first light transmitting material having a first index of refraction, said first optical element comprising a first boundary arranged to intersect the light path, said first boundary having a surface finish effective to scatter light impinging on the first boundary;
    a second optical element comprising a second boundary arranged to intersect the light path, said second boundary arranged to face the first boundary and to be separated from the first boundary by a gap that intersects the light path; and
    an index matching region occupying a portion of the gap, said index matching region comprising a second light transmitting material that having a matching index of refraction after being dispensed, said index matching region arranged to contact a first portion of the first boundary and contact a second portion of the second boundary such that light in the first optical element directed toward the first boundary that is within the first portion propagates to the second portion, and light directed toward the first boundary that is not within the first portion is scattered.

2. The system in accordance with claim 1, wherein the matching index of refraction is substantially equal to the first index of refraction.

3. The system in accordance with claim 1, wherein said second optical element comprises an imaging device, said second boundary comprises an imaging side of the imaging device, and said second portion comprises an imaging area of the imaging device.

4. The system in accordance with claim 3, wherein said imaging device is arranged in an integrated circuit package defining an opening for light to illuminate the imaging device, and said first optical element comprises a window arranged to cover the opening.

5. The system in accordance with claim 4, wherein said index matching region comprises a plurality of separate regions formed of the second light transmitting material between the first boundary and the second boundary.

6. The system in accordance with claim 4, wherein said system further comprises a third optical element formed of a third light transmitting material having a third index of refraction, said third optical element comprises a third boundary arranged to intersect the light path, said third boundary having a surface finish effective to scatter light impinging on the third boundary,
    said first optical element further comprises a fourth boundary arranged to intersect the light path, said fourth boundary having a surface finish effective to scatter light impinging on the fourth boundary, said fourth boundary arranged to face the third boundary and to be separated from the third boundary by a second gap, said system further comprising
    a second index matching region occupying a portion of the second gap, said second index matching region filled with a fourth light transmitting material having a fluidic state when dispensed and a second matching index of refraction, said second index matching region arranged to contact a third portion of the third boundary and contact a fourth portion of the fourth boundary such that light in the third optical element directed toward the third boundary that is within the third portion propagates to the fourth portion, and light directed toward the third boundary that is not within the third portion is scattered.

7. The system in accordance with claim 6, wherein the first index of refraction and the third index of refraction are substantially unequal, and the second matching index of refraction is selected based on the surface finishes of the third boundary and the fourth boundary.

8. The system in accordance with claim 1, wherein said second optical element is formed of a third light transmitting material having a third index of refraction.

9. The system in accordance with claim 8, wherein the third index of refraction is substantially equal to the first index of refraction.

10. The system in accordance with claim 8, wherein said second boundary has a surface finish effective to scatter light impinging on the second boundary except where the second portion is in contact with the index matching region such that light directed toward the first portion and the second portion is not scattered.

11. The system in accordance with claim 1, wherein the second light transmitting material has a fluidic state when dispensed.

12. A method for controlling light propagation along a light path comprising the steps of:
    forming a first optical element to define a first boundary, said first optical element formed of a first light transmitting material and said first boundary having a surface finish effective to scatter light impinging on the first boundary;
    forming a second optical element to define a second boundary;

arranging the first optical element and the second optical element so that the first boundary and the second boundary intersect the light path and to define a gap therebetween;

dispensing an index matching material into an index matching region of the gap to make contact with a first portion of the first boundary and a second portion of the second boundary effective to minimize the scattering effect of the surface finish within the first portion such that light passes through the first portion to the second boundary.

* * * * *